(12) United States Patent
Lim et al.

(10) Patent No.: US 11,024,685 B2
(45) Date of Patent: Jun. 1, 2021

(54) ELECTROLUMINESCENT DISPLAY DEVICE

(71) Applicant: LG Display Co., Ltd., Seoul (KR)

(72) Inventors: Hyeong-Jun Lim, Paju-si (KR); Ji-Yeon Park, Paju-si (KR); Han-Sun Park, Paju-si (KR)

(73) Assignee: LG Display Co., Ltd., Seoul (KR)

( * ) Notice: Subject to any disclaimer, the term of this patent is extended or adjusted under 35 U.S.C. 154(b) by 0 days.

(21) Appl. No.: 16/213,238

(22) Filed: Dec. 7, 2018

(65) Prior Publication Data
US 2019/0181202 A1 Jun. 13, 2019

(30) Foreign Application Priority Data
Dec. 11, 2017 (KR) .......................... 10-2017-0168985

(51) Int. Cl.
| | |
|---|---|
| H01L 27/32 | (2006.01) |
| H01L 51/50 | (2006.01) |
| H01L 51/52 | (2006.01) |
| H01L 21/764 | (2006.01) |
| G09G 3/3233 | (2016.01) |

(52) U.S. Cl.
CPC ........ *H01L 27/3246* (2013.01); *H01L 21/764* (2013.01); *H01L 27/322* (2013.01); *H01L 27/3209* (2013.01); *H01L 27/3258* (2013.01); *H01L 51/5044* (2013.01); *H01L 51/5056* (2013.01); *H01L 51/5072* (2013.01); *H01L 51/5088* (2013.01); *H01L 51/5092* (2013.01); *H01L 51/5215* (2013.01); *H01L 51/5218* (2013.01); *H01L 51/5225* (2013.01); *H01L 51/5234* (2013.01); *H01L 51/5253* (2013.01); *H01L 51/5271* (2013.01); *H01L 51/5278* (2013.01); *G09G 3/3233* (2013.01); *G09G 2300/0842* (2013.01); *G09G 2320/0214* (2013.01); *G09G 2320/0242* (2013.01); *H01L 51/5265* (2013.01); *H01L 2227/323* (2013.01); *H01L 2251/5315* (2013.01)

(58) Field of Classification Search
CPC .............. H01L 27/3246; H01L 27/322; H01L 51/5044; H01L 51/5225
See application file for complete search history.

(56) References Cited

U.S. PATENT DOCUMENTS

| | | |
|---|---|---|
| 2007/0194696 A1 | 8/2007 | Hsu et al. |
| 2009/0174320 A1 | 7/2009 | Kim |
| 2012/0161167 A1 | 6/2012 | Yamazaki |

(Continued)

OTHER PUBLICATIONS

Combined Search and Examination Report dated May 15, 2019 from the United Kingdom Intellectutal Property Office in corresponding application No. 1820182.2.

(Continued)

*Primary Examiner* — Matthew L Reames
(74) *Attorney, Agent, or Firm* — Morgan, Lewis & Bockius LLP

(57) ABSTRACT

An electroluminescent display device includes a substrate including a plurality of pixel regions; an air gap over the substrate and configured to separate the plurality of pixel regions; a first electrode in each of the plurality of pixel regions; an insulating pattern covering an edge of the first electrode; a light emitting portion on the first electrode and the insulating pattern; and a second electrode on the light emitting portion.

20 Claims, 8 Drawing Sheets

(56) References Cited

U.S. PATENT DOCUMENTS

| | | |
|---|---|---|
| 2012/0248475 A1 | 10/2012 | Yamada et al. |
| 2016/0181525 A1 | 6/2016 | Kato et al. |
| 2016/0359142 A1 | 12/2016 | Huangfu et al. |
| 2017/0352708 A1 | 12/2017 | Yamaguchi et al. |
| 2018/0277778 A1* | 9/2018 | Pentlehner .......... H01L 51/0092 |
| 2019/0165322 A1* | 5/2019 | Shinya ................ H01L 27/3244 |

OTHER PUBLICATIONS

Office Action dated Sep. 16, 2020, issued in corresponding German Patent Application No. 10 2018 131 255.5.
Office Action dated Dec. 14, 2020, issued in corresponding German Patent Application No. 10 2018 131 255.5.

* cited by examiner

ELECTROLUMINESCENT DISPLAY DEVICE

CROSS-REFERENCE TO RELATED APPLICATIONS

This application claims the benefit under 35 U.S.C. § 119(a) of Korean Patent Application No. 10-2017-0168985, filed on Dec. 11, 2017, in the Korean Intellectual Property Office, which is incorporated herein by reference in its entirety.

BACKGROUND

1. Technical Field

The present disclosure relates to an electroluminescent display device, and more particularly, to an electroluminescent display device capable of improving light extraction efficiency as well as preventing or reducing current leakage and color mixing.

2. Discussion of the Related Art

In recent years, flat panel displays having excellent characteristics, such as a thin profile, low weight, and low power consumption, have been widely developed and applied to various fields. Among the flat panel displays, an electroluminescent display device is a device in which electrical charge carriers are injected into a light-emitting layer formed between a cathode, which is an electron-injecting electrode, and an anode, which is a hole-injecting electrode, such that excitons are formed. Then, radiative recombination of the excitons occurs, thereby emitting light.

The electroluminescent display device has a number of advantageous characteristics. For example, the electroluminescent display device can be formed using a flexible substrate, such as plastic, is self-luminous, and has excellent contrast ratios. Further, the electroluminescent display device has a response time of several microseconds, thereby providing advantages in displaying moving images. The electroluminescent display device also has a wide viewing angle and is stable under low temperatures. Because the electroluminescent display device is driven by a low voltage of direct current DC 5V to 15V, driving circuits can be easily designed and manufactured.

There is an electroluminescent display device that emits white light using at least two light-emitting layers. For example, first and second light-emitting layers (first and second stacks) are formed having a two-stack structure. A carrier generation layer (CGL) is disposed over an entire surface of a display region between the two stacks, thereby emitting white light. In the electroluminescent display device, a color filter pattern is used for converting white light into red, green, or blue (RGB) light because the light-emitting layers emit white light.

In this case, due to high conductivity of the carrier generation layer, adjacent pixels are also turned on at the same time when mono color light is turned on such that a color anomaly occurs and image quality of the electroluminescence display device is degraded.

SUMMARY

Accordingly, embodiments of the present disclosure are directed to an electroluminescent display device that substantially obviates one or more of the problems due to limitations and disadvantages of the related art.

It is an aspect of the present disclosure to provide an electroluminescent display device that is capable of improving light extraction efficiency and preventing or reducing current leakage and color mixing.

Additional features and aspects will be set forth in the description that follows, and in part will be apparent from the description, or may be learned by practice of the inventive concepts provided herein. Other features and aspects of the inventive concepts may be realized and attained by the structure particularly pointed out in the written description, or derivable therefrom, and the claims hereof as well as the appended drawings.

To achieve these and other aspects of the inventive concepts, as embodied and broadly described, an electroluminescent display device comprises a substrate including a plurality of pixel regions; an air gap over the substrate and configured to separate the plurality of pixel regions; a first electrode in each of the plurality of pixel regions; a light emitting portion on the first electrode and a second electrode on the light emitting portion.

It is to be understood that both the foregoing general description and the following detailed description are explanatory and are intended to provide further explanation of the inventive concepts as claimed.

BRIEF DESCRIPTION OF THE DRAWINGS

The accompanying drawings, which are included to provide a further understanding of the disclosure, are incorporated in and constitute a part of this application, illustrate implementations of the disclosure and together with the description serve to explain various principles.

DETAILED DESCRIPTION

Hereinafter, example embodiments of the present disclosure will be described with reference to the accompanying drawings.

Figure 1:
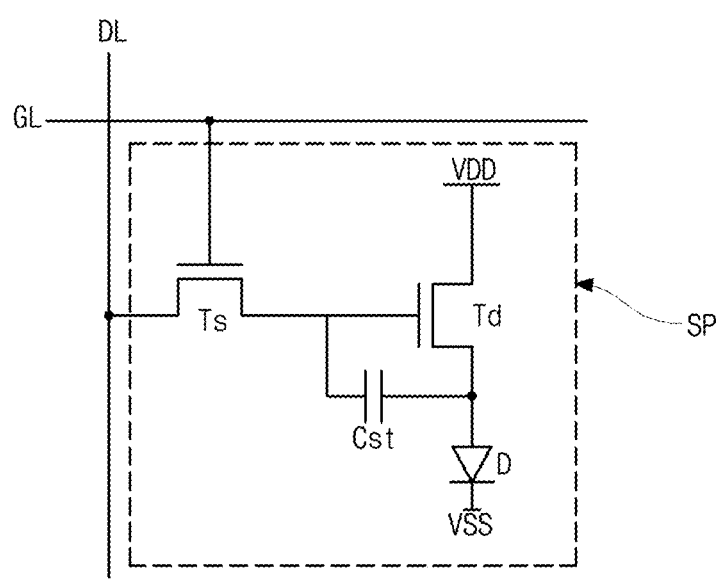
FIG. 1 is a circuit diagram showing a single pixel region of an electroluminescent display device according to an example embodiment of the present disclosure.

FIG. 1 is a circuit diagram showing a single pixel region of an electroluminescent display device according to an example embodiment of the present disclosure.

As illustrated in FIG. 1, the electroluminescent display device may include a gate line GL, a data line DL, a switching thin film transistor Ts, a driving thin film transistor Td, a storage capacitor Cst, and a light-emitting diode D. The gate line GL and the data line DL cross each other to define a pixel region SP. The switching thin film transistor Ts, the driving thin film transistor Td, the storage capacitor Cst, and the light-emitting diode D are formed in the pixel region SP.

A gate electrode of the switching thin film transistor Ts may be connected to the gate line GL and a source electrode of the switching thin film transistor Ts is connected to the data line DL. A gate electrode of the driving thin film transistor Td may be connected to a drain electrode of the switching thin film transistor Ts, and a source electrode of the driving thin film transistor Td may be connected to a high voltage supply VDD. An anode of the light-emitting diode D may be connected to a drain electrode of the driving thin film transistor Td, and a cathode of the light-emitting diode D may be connected to a low voltage supply VSS. The storage capacitor Cst may be connected to the gate electrode and the drain electrode of the driving thin film transistor Td.

The electroluminescent display device is driven to display an image. For example, when the switching thin film transistor Ts is turned on by a gate signal applied through the gate line GL, a data signal from the data line DL is applied to the gate electrode of the driving thin film transistor Td and an electrode of the storage capacitor Cst through the switching thin film transistor Ts.

When the driving thin film transistor Td is turned on by the data signal, an electric current flowing through the light-emitting diode D is controlled, thereby displaying an image. The light-emitting diode D emits light due to the current supplied through the driving thin film transistor Td from the high voltage supply VDD.

For example, the amount of the current flowing through the light-emitting diode D is proportional to the magnitude of the data signal, and the intensity of light emitted by the light-emitting diode D is proportional to the amount of the current flowing through the light-emitting diode D. Thus, pixel regions SP show different gray levels depending on the magnitude of the data signal. As a result, the electroluminescent display device displays an image.

The storage capacitor Cst maintains charges corresponding to the data signal for a frame when the switching thin film transistor Ts is turned off. Accordingly, even if the switching thin film transistor Ts is turned off, the storage capacitor Cst allows the amount of the current flowing through the light-emitting diode D to be constant and the gray level shown by the light-emitting diode D to be maintained until a next frame. Also, a transistor and/or a capacitor other than the switching and driving thin film transistors Ts and Td and the storage capacitor Cst may be further added in the pixel region SP.

Figure 2:
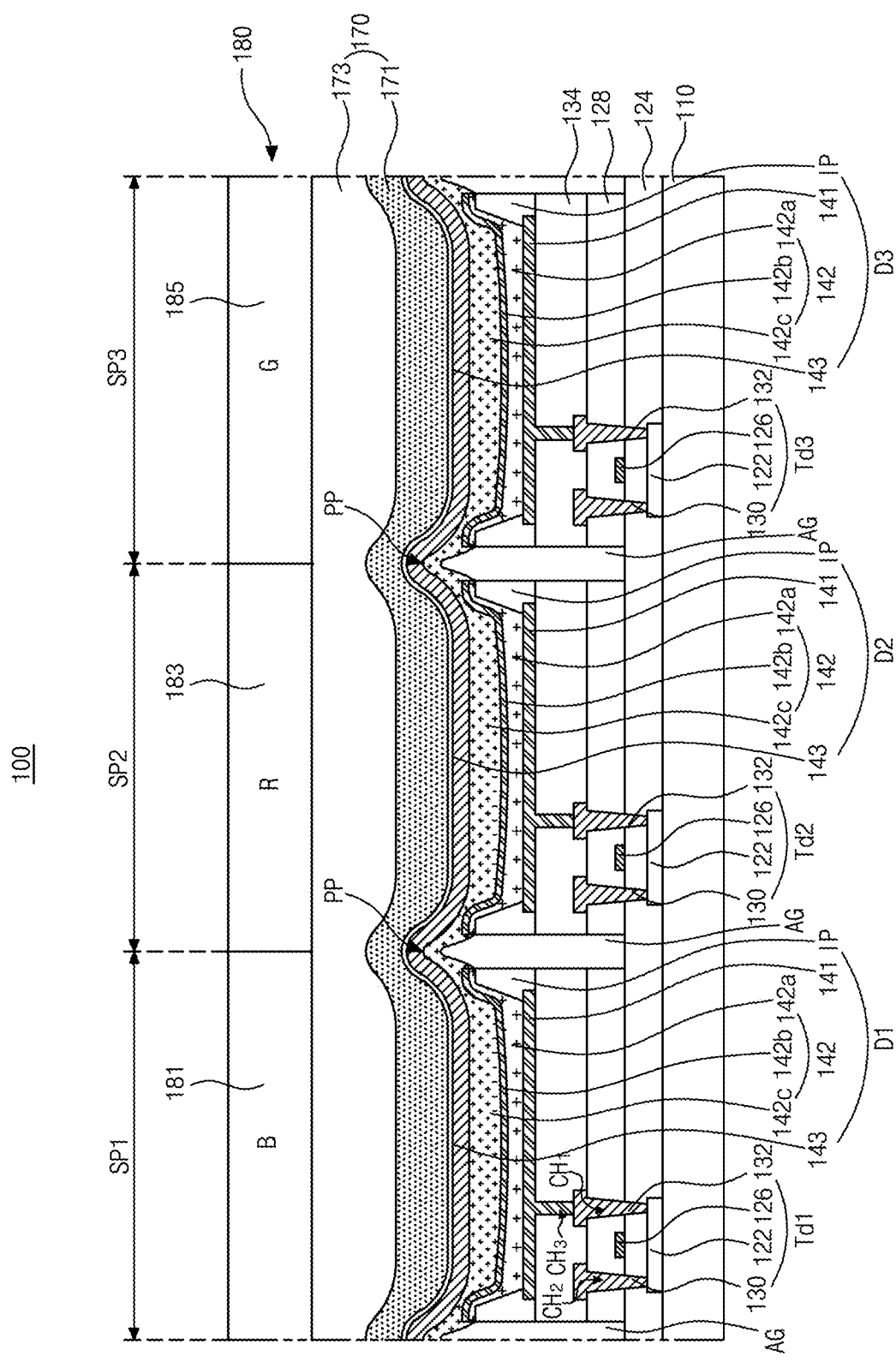
FIG. 2 is a cross-sectional view showing an electroluminescent display device according to an example embodiment of the present disclosure.

FIG. 2 is a cross-sectional view showing an electroluminescent display device according to an example embodiment of the present disclosure.

As shown in FIG. 2, an electroluminescent display device 100 may include a substrate 110, thin film transistors Td1, Td2, and Td3 and light-emitting diodes D1, D2, and D3, which are formed in pixel regions SP1, SP2, and SP3 on the substrate 110, respectively, an encapsulation layer 170 on the light-emitting diodes D1, D2, and D3, and a color filter layer 180 on the encapsulation layer 170. For example, the thin film transistors Td1, Td2, and Td3 and the light-emitting diodes D1, D2, and D3 may be formed on the substrate 110, which may be referred to as a lower substrate, a TFT substrate, or a backplane, respectively, for each of the pixel regions SP1, SP2, and SP3.

Here, each of the pixel regions SP1, SP2, and SP3 refers to a unit in which a specific type of color filter patterns 181, 183, and 185 are formed to emit specific color light. For example, the pixel regions SP1, SP2, and SP3 may include a blue pixel region SP1, a red pixel region SP2, and a green pixel region SP3, but the present disclosure is not limited thereto, and the pixel regions SP1, SP2, and SP3 may further include a white pixel region.

In the electroluminescent display device 100, air gaps AG may be formed between the pixel regions SP1, SP2, and SP3. For example, the air gaps AG, which separate the pixel regions SP1, SP2, and SP3, may be formed on the substrate 110. The air gaps AG will be described below in more detail.

A semiconductor layer 122 may be formed in each of the pixel regions SP1, SP2, and SP3. A gate insulating layer 124 may be formed on the semiconductor layer 122 substantially all over the substrate 110 including the pixel regions SP1, SP2, and SP3. The semiconductor layer 122 may include an active area, which is made of an intrinsic semiconductor material and is positioned at a center thereof, and a source area and a drain area, which are made of an impurity-doped semiconductor material and are positioned at left and right sides of the active area.

A gate electrode 126 may be formed on the gate insulating layer 124 corresponding to the semiconductor layer 122. An interlayer insulating layer 128 may be formed on the gate electrode 126. The interlayer insulating layer 128 and the gate insulating layer 124 may include first and second contact holes CH1 and CH2 through which the source area and the drain area of the semiconductor layer 122 are respectively exposed.

A source electrode 132 and a drain electrode 130, which are spaced apart from each other, may be formed on the interlayer insulating layer 128 corresponding to the semiconductor layer 122. The source electrode 132 and the drain electrode 130 may be connected to the source area and the drain area of the semiconductor layer 122 through the first and second contact holes CH1 and CH2, respectively. Here, the semiconductor layer 122, the gate electrode 126, the source electrode 132, and the drain electrode 130, which are formed for each of the pixel regions SP1, SP2, and SP3, may constitute each of the thin film transistors Td1, Td2, and Td3.

Although coplanar type thin film transistors Td1, Td2, and Td3 have been illustrated in FIG. 2 as an example, embodiments are not limited thereto, and staggered type thin film transistors may also be formed. Although only the driving thin film transistors Td1, Td2, and Td3 are illustrated in FIG. 2, a plurality of thin film transistors, such as the switching thin film transistor Ts of FIG. 1 having the same structure as the driving thin film transistors Td1, Td2, and Td3, may be formed in a single pixel region. Although not illustrated, a gate line GL of FIG. 1, a data line DL of FIG. 1 and a power line crossing each other to define the pixel regions SP1, SP2, and SP3 may be formed. The switching thin film transistor Ts of FIG. 1 may be connected to the gate line GL of FIG. 1 and the data line DL of FIG. 1, and each driving thin film transistor Td1, Td2, and Td3 may be connected to the switching thin film transistor Ts of FIG. 1 and the power line.

A passivation layer 134 may be formed on each of the thin film transistors Td1, Td2, and Td3. The passivation layer 134 may include a third contact hole CH3 exposing the source electrode 132.

Meanwhile, an overcoat layer may be disposed on the passivation layer 134. In this case, the passivation layer 134 and the overcoat layer may include the third contact hole CH3 exposing the source electrode 132.

Here, holes that separate the respective pixel regions SP1, SP2, and SP3 may be formed in the passivation layer 134 and the interlayer insulating layer 128. Here, widths of the holes of the passivation layer 134 and the interlayer insulating layer 128 are the same, but the present disclosure is not limited thereto, and the hole of the interlayer insulating layer 128 may be formed to have a width greater than that of the hole of the passivation layer 134 to form an undercut shape. The holes, which are formed in the passivation layer 134 and the interlayer insulating layer 128, form portions of the air gaps AG that separate the respective pixel regions SP1, SP2, and SP3.

A first electrode 141 may be disposed on the passivation layer 134 of each of the pixel regions SP1, SP2, and SP3. Here, the first electrode 141 may be an anode or cathode for supplying one of holes or electrons to a light emitting portion 142.

A case in which the first electrode 141 of the electroluminescent display device 100 according to the embodiment of the present disclosure is an anode will be described as an example. The first electrode 141 may be formed as a single layer of a transparent conductive oxide (TCO) material, such as indium tin oxide (ITO). To obtain a micro-cavity effect, the first electrode 141 may be formed of a metal material with a relatively high reflectance, such as a stacked structure of aluminum (Al) and titanium (Ti) (Ti/Al/Ti), a stacked structure of aluminum (Al) and ITO (ITO/Al/ITO), an Ag—Pd—Cu (APC) alloy, or a stacked structure of an APC alloy and ITO (ITO/APC/ITO). The APC alloy refers to an alloy of silver (Ag), palladium (Pd), and copper (Cu). The first electrode 141 may be connected to the source electrode 132 of each of the thin film transistors Td1, Td2, and Td3 through the third contact hole CH3 formed in the passivation layer 134 and may be separately formed for each of the pixel regions SP1, SP2, and SP3.

The electroluminescent display device 100 has been described using an example which presumes that the thin film transistor is an N-type thin film transistor in which the first electrode 141 is connected to the source electrode 132, but the present disclosure is not limited thereto. When each of the thin film transistors Td1, Td2, and Td3 is a P-type thin film transistor, the first electrode 141 may be connected to the drain electrode 130.

An insulating pattern IP that covers an edge of the first electrode 141 may be disposed on the first electrode 141. For example, the insulating pattern IP that covers side surfaces and a portion of an upper surface of the first electrode 141 may be used. The insulating pattern IP may be made of silicon oxide having a refractive index of 1.3 to 1.55, but the present disclosure is not limited thereto.

Here, a stepped portion of the first electrode 141 may be reduced by the insulating pattern IP and thus current efficiency can be improved. For example, when the light emitting portion 142 is formed on the first electrode 141, the light emitting portion 142 is formed to have a small thickness in a region of the stepped portion of the first electrode 141 so that concentration of current that does not contribute to light emission may be prevented or reduced.

Further, the insulating patterns IP may be separated for each of the pixel regions SP1, SP2, and SP3 by holes corresponding to boundaries of the pixel regions SP1, SP2, and SP3. Here, widths of the holes that separate the insulating patterns IP may be the same for each of the pixel regions SP1, SP2, and SP3, but the present disclosure is not limited thereto. The holes that separate the insulating patterns IP for each of the pixel regions SP1, SP2, and SP3 form portions of the air gaps AG that separate the respective pixel regions SP1, SP2, and SP3.

The light emitting portion 142 may be disposed on the first electrode 141 and the insulating pattern IP. Here, the light emitting portion 142 may emit white light. For example, the light emitting portion 142 may have a two-stack structure with first and second light-emitting layers 142a and 142c, and a carrier generation layer (CGL) 142b may be disposed between the first light-emitting layer 142a and the second light-emitting layer 142c. However, the present disclosure is not limited thereto, and the light emitting portion 142 may have a three-stack structure or an n-stack structure rather than a two-stack structure.

Here, the light emitting portion 142 may include a first light-emitting layer 142a, which emits blue light, and a second light-emitting layer 142c, which is disposed on the first light-emitting layer 142a and emits light having color that turns white when mixed with blue. The second light-emitting layer 142c may be a light-emitting layer which emits yellow-green light. However, the present disclosure is not limited thereto.

The carrier generation layer 142b may be formed between the first light-emitting layer 142a and the second light-emitting layer 142c to adjust a balance of a charge between the first light-emitting layer 142a and the second light-emitting layer 142c. For example, the carrier generation layer 142b may include an N layer, which is positioned adjacent to the first light-emitting layer 142a and injects electrons into the first light-emitting layer 142a, and a P layer, which is positioned adjacent to the second light-emitting layer 142c and injects holes into the second light-emitting layer 142c. To prevent a metal dopant included in the N layer from being diffused into the P layer due to a driving force received according to an electric field of the electroluminescent display device, an interlayer may be further interposed between the N layer and the P layer.

However, the above-described structure of the light emitting portion 142 is merely an example, and the present disclosure is not limited thereto. The light emitting portion 142 may have a structure in which three or more light-emitting layers and a plurality of carrier generation layers are stacked.

A luminescent material of each of the first and second light-emitting layers 142a and 142c may be an organic luminescent material having a refractive index of about 1.8 or higher, or an inorganic luminescent material, such as a quantum dot. Here, the first light-emitting layer 142a and the carrier generation layer 142b may be disposed inside the insulating pattern IP. For example, an upper end portion of the insulating pattern IP may have a protruding shape having a constantly inclined surface inwardly in each of the pixel region SP1, SP2 and SP3, and the first light-emitting layer 142a and the carrier generation layer 142b which are disposed on the first electrode 141 may be surrounded by the inclined surface of the insulating pattern IP.

The first light-emitting layer 142a and the carrier generation layer 142b may be formed to have a relatively thicker end due to the inner inclined surface of the insulating pattern IP. However, the present disclosure is not limited thereto. For example, the light emitting portion 142 may be formed to have a relatively thinner end on the insulating pattern IP and a portion of the light emitting portion 142 may have a shape that is cut at an upper portion of the air gap AG. For example, the first light-emitting layer 142a and the carrier generation layer 142b may have a shape that is cut at the upper portion of the air gap AG to be disconnected from the first light-emitting layer 142a and the carrier generation layer 142b in the adjacent pixel regions, and only the second light-emitting layer 142c may have a shape which covers the upper portion of the air gap AG to be connected to the second light-emitting layer 142c in the adjacent pixel regions.

As described above, each of the first light-emitting layer 142a and the carrier generation layer 142b may be disposed separately in each of the plurality of pixel regions SP1, SP2, and SP3 due to the insulating pattern IP. The first light-emitting layer 142a and the carrier generation layer 142b may be completely separated in each of the plurality of pixel regions SP1, SP2, and SP3. Alternatively, the first light-emitting layer 142a and the carrier generation layer 142b may be partially separated in each of the plurality of pixel regions SP1, SP2, and SP3. For example, one portion of the first light-emitting layer 142a and the carrier generation layer 142b may be separated in between the adjacent pixel regions, and the other portion of the first light-emitting layer 142a and the carrier generation layer 142b may be connected.

Accordingly, leakage current can be prevented or reduced from flowing to adjacent pixel regions, and thus degradation of image quality which is caused due to unintentional driving of the adjacent pixel regions can be prevented or reduced.

The second light-emitting layer 142c may be disposed on the carrier generation layer 142b, the insulating pattern IP, and the air gap AG. Here, unlike the first light-emitting layer 142a and the carrier generation layer 142b, the second light-emitting layer 142c may be disposed over a substantially entire surface of the substrate 110 including the plurality of pixel regions SP1, SP2, and SP3. The second light-emitting layer 142c in each of the pixel regions SP1, SP2, and SP3 may have a shape in which both ends protrude upward due to the shapes of the insulating pattern IP, the first light-emitting layer 142a, and the carrier generation layer 142b.

Here, the both ends that protrude upward of the second light-emitting layer 142c formed in each of the pixel regions SP1, SP2, and SP3 may be connected to each other. Accordingly, the second light-emitting layer 142c may be formed on the substantially entire surface of the substrate 110 including the pixel regions SP1, SP2, and SP3 with protrusions PP that are formed to correspond to the boundaries of the plurality of pixel regions SP1, SP2, and SP3.

Further, the second light-emitting layer 142c may have a shape that is concave in a region between the protrusions PP. However, the present disclosure is not limited thereto, and the region between the protrusions PP may be flat.

A gap may be formed in a lower portion of the protrusion PP. The gap in the lower portion of the protrusion PP forms a portion of the air gap AG.

As described above, each of the first light-emitting layer 142a and the carrier generation layer 142b, which are formed separately in each of the pixel regions SP1, SP2, and SP3 due to the air gaps AG, and the second light-emitting layer 142c, which is formed on the substantially entire surface of the substrate 110 including the pixel regions SP1, SP2, and SP3, overlap to form the light emitting portion 142.

The second electrode 143 for supplying one of electrons or holes to the light emitting portion 142 may be disposed on the light emitting portion 142. Here, the second electrode 143 may be a cathode or an anode. A case in which the second electrode 143 of the electroluminescent display device 100 according to the embodiment of the present disclosure is a cathode will be described as an example.

Here, the second electrode 143 is formed to follow the morphology of the light emitting portion 142. For example, the second electrode 143 may be formed to have a shape that follows the morphology of the second light-emitting layer 142c including the protrusion PP. Further, the second electrode 143 may be formed to have protruding portions that protrude to correspond to the boundaries of the plurality of pixel regions SP1, SP2, and SP3 and a concave portion between the protruding portions, along the shape of the second light-emitting layer 142c. However, the present disclosure is not limited thereto. For example, a portion between the protruding portions may be formed to be flat. The second electrode 143 may be formed of a TCO material such as ITO or indium zinc oxide (IZO) capable of transmitting light, or may be formed of a semi-transmissive conductive material, such as magnesium (Mg), silver (Ag), or an alloy of magnesium (Mg) and silver (Ag).

As described above, the first electrode 141, the insulating pattern IP, the light emitting portion 142, and the second electrode 143 overlap to form each of the light-emitting diodes D1, D2, and D3. The light-emitting diodes D1, D2, and D3 may be respectively disposed to correspond to the pixel regions SP1, SP2, and SP3 by the air gaps AG. Further, an upper end of the air gap AG may be positioned at a higher level than an upper portion of the insulating pattern IP.

Accordingly, a path of light that is obliquely output from the light emitting portion 142 of each of the light-emitting diodes D1, D2, and D3 is changed in a vertical direction by the insulating pattern IP and the air gap AG. Then, the light is output to the outside, and thus light extraction efficiency can be improved, and at the same time, color mixing can be prevented or reduced.

The encapsulation layer 170 may be disposed on the second electrode 143. Here, the encapsulation layer 170 may include a first encapsulation layer 171 and a second encapsulation layer 173.

The first encapsulation layer 171 may be formed to follow the morphology of the second electrode 143. For example, the first encapsulation layer 171 may be formed to have protruding portions which protrude to correspond to the boundaries of the plurality of pixel regions SP1, SP2, and SP3 and a concave portion between the protruding portions. However, the present disclosure is not limited thereto, and a portion between the protruding portions may be formed to be flat.

Here, the first encapsulation layer 171 may be formed of an inorganic film and may have a multilayer structure. For example, the first encapsulation layer 171 may include at least one layer formed of silicon nitride, aluminum nitride, zirconium nitride, titanium nitride, hafnium nitride, tantalum nitride, silicon oxide, aluminum oxide, and/or titanium oxide.

The second encapsulation layer 173 may be disposed on the first encapsulation layer 171. The second encapsulation layer 173 may be formed of an organic film and may have a multilayer structure. Further, the second encapsulation layer 173 may have a flat upper surface.

Meanwhile, the color filter layer 180 may be disposed on the encapsulation layer 170. For example, the color filter layer 180 may be disposed on the second encapsulation layer 173. Here, the color filter layer 180 may include the color filter patterns 181, 183, and 185, which are respectively formed to correspond to the pixel regions SP1, SP2, and SP3.

In the color filter layer 180 of the electroluminescent display device 100, a black matrix is omitted between the color filter patterns 181, 183, and 185 so that a light emitting area may be increased. A path of light, which is obliquely output from each of the light-emitting diodes D1, D2, and D3 in the pixel regions SP1, SP2, and SP3, is changed in a vertical direction by the insulating pattern IP which is formed in each of the pixel regions SP1, SP2, and SP3 and the air gaps AG which are formed at the boundaries of the pixel regions SP1, SP2, and SP3 and the light may be output to an upper region corresponding to each of the pixel regions SP1, SP2, and SP3, and thus light extraction efficiency can be improved, and at the same time, color mixing can be effectively prevented or reduced.

Further, the carrier generation layer 142b is separately formed in each of the pixel regions SP1, SP2, and SP3 by the insulating pattern IP. As such, leakage current can be prevented or reduced from flowing to adjacent pixel regions. Thus, degradation of image quality that is caused due to unintentional driving of the adjacent pixel regions can be prevented or reduced.

Figure 3:
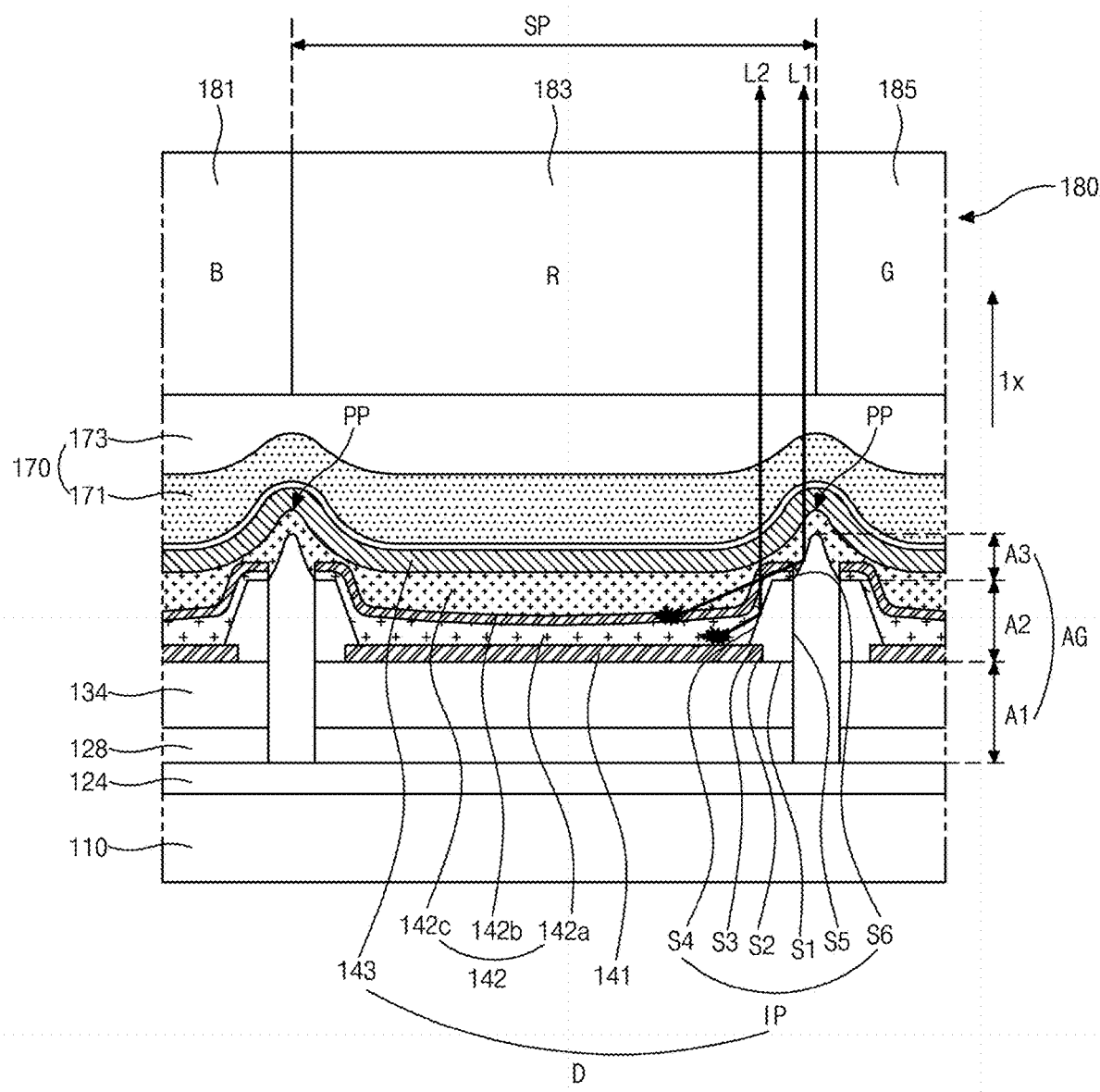
FIG. 3 is an enlarged view of a portion of an electroluminescent display device according to the example embodiment of FIG. 2.

FIG. 3 is an enlarged view of a portion of an electroluminescent display device according to the example embodiment of FIG. 2.

As shown in FIG. 3, the electroluminescent display device 100 of FIG. 2 may include a substrate 110, a light-emitting diode D on the substrate 110, an encapsulation layer 170 on the light-emitting diode D, and a color filter layer 180 on the encapsulation layer 170. A gate insulating layer 124, an interlayer insulating layer 128, and a passivation layer 134 may be disposed between the substrate 110 and the light-emitting diode D.

Here, holes are formed in the passivation layer 134 and the interlayer insulating layer 128 to correspond to boundaries of pixel regions SP. The hole, which is formed in the passivation layer 134 and the interlayer insulating layer 128, forms a first portion A1 of an air gap AG that separates the pixel regions SP.

An insulating pattern IP that covers an edge of a first electrode 141 may be disposed on the first electrode 141. For example, the insulating pattern IP that covers a side surface and a portion of an upper surface of the first electrode 141 may be used. Here, the insulating pattern IP may include a first surface S1 contacting the passivation layer 134, a second surface S2 contacting the side surface of the first electrode 141, a third surface S3 contacting the portion of the upper surface of the first electrode 141, a fourth surface S4, which is an inner surface having a constant inclination, a fifth surface S5, which is an outer surface opposite to the fourth surface S4, and a sixth surface S6, which is an upper surface connecting the fourth surface S4 and the fifth surface S5.

The insulating pattern IP may be made of silicon oxide having a refractive index of 1.3 to 1.55, but the present disclosure is not limited thereto. Further, the insulating patterns IP may be separated for each pixel region SP by holes corresponding to boundaries of the respective pixel regions SP. Here, widths of the holes that separate the insulating patterns IP may be the same for each pixel region SP, but the present disclosure is not limited thereto.

The holes that separate the insulating patterns IP for each pixel region SP form a second portion A2 of the air gap AG that separate the respective pixel region SP. A light emitting portion 142 may be disposed on the first electrode 141 and the insulating pattern IP. Here, the light emitting portion 142 may emit white light. For example, the light emitting portion 142 may have a two-stack structure with first and second light-emitting layers 142a and 142c, and a carrier generation layer 142b may be disposed between the first light-emitting layer 142a and the second light-emitting layer 142c.

A luminescent material of each of the first and second light-emitting layers 142a and 142c may be an organic luminescent material having a refractive index of about 1.8 or higher, or an inorganic luminescent material, such as a quantum dot. Here, side surfaces of the first light-emitting layer 142a and the carrier generation layer 142b may contact the fourth surface S4 of the insulating pattern IP. For example, the first light-emitting layer 142a may be disposed on the first electrode 141 and may have a shape that is surrounded by the fourth surface S4 of the insulating pattern IP. The carrier generation layer 142b may be disposed on the first light-emitting layer 142a and may have a shape that is surrounded by the fourth surface S4 of the insulating pattern IP.

As described above, each of the first light-emitting layer 142a and the carrier generation layer 142b may be disposed separately in each of the plurality of pixel regions SP due to being surrounded by the fourth surface S4 of the insulating pattern IP. However, the present disclosure is not limited thereto, and the light emitting portion 142 may be formed on the sixth surface S6 of the insulating pattern IP to have a relatively thin thickness and a portion of the light emitting portion 142 may have a shape that is cut at an upper portion of the air gap AG. For example, the first light-emitting layer 142a and the carrier generation layer 142b may have a shape that is cut at the upper portion of the air gap AG to be disconnected from the first light-emitting layer 142a and the carrier generation layer 142b in the adjacent pixel regions and only the second light-emitting layer 142c may have a shape that covers the upper portion of the air gap AG to be connected to the second light-emitting layer 142c in the adjacent pixel region.

Accordingly, leakage current can be prevented or reduced from flowing to adjacent pixel regions by the carrier generation layer 142b. Thus, degradation of image quality caused by unintentional driving of the adjacent pixel regions can be prevented or reduced.

The second light-emitting layer 142c may be disposed on the carrier generation layer 142b, the insulating pattern IP, and the air gap AG. Here, unlike the first light-emitting layer 142a and the carrier generation layer 142b, the second light-emitting layer 142c may be disposed over the substantially entire surface of the substrate 110 including the plurality of pixel regions SP.

For example, the second light-emitting layer 142c in each pixel region SP may be formed to follow the morphology of the upper surface of the carrier generation layer 142b and the fourth surface S4 and the sixth surface S6 of the insulating pattern IP and may have a shape that extends to the boundary of the pixel region SP so that both ends thereof protrude upward. Here, the both ends, which protrude upward the second light-emitting layer 142c formed in each pixel region SP, may be connected to each other at the boundary of the pixel region SP.

Accordingly, the second light-emitting layer 142c may be formed on the substantially entire surface of the substrate 110 including the plurality of pixel regions SP. The second light-emitting layer 142c may have protrusions PP that are respectively formed to correspond to the boundaries of the plurality of pixel regions SP. A gap may be formed in a lower portion of the protrusion PP, and the gap in the lower portion of the protrusion PP forms a third portion A3 of the air gap AG.

The above-described structure of the second light-emitting layer 142c is merely an example, and the present disclosure is not limited thereto. The second light-emitting layer 142c may be separately formed for each pixel region SP.

As described above, the air gap AG may include the first portion A1 formed in the passivation layer 134 and the interlayer insulating layer 128, the second portion A2 formed between the insulating patterns IP, and the third portion A3 formed at the lower portion of the protrusion PP. For example, the air gap AG may be divided into the first portion A1, which contacts the passivation layer 134 and the interlayer insulating layer 128, the second portion A2, which contacts the insulating pattern IP, and the third portion A3, which contacts the protrusion PP of the second light-emitting layer 142c.

Further, the first portion A1, the second portion A2, and the third portion A3 of the air gap AG may be disposed in parallel to a first axis 1X perpendicular to the substrate 110. The first portion A1 and the second portion A2 of the air gap AG may have a constant width and the third portion A3 of the air gap AG may have a decreasing width upward, but the present disclosure is not limited thereto.

The air gap AG may be formed to have a refractive index of 1.0, but a material having a refractive index of 1.0 to 1.55 other than the air gap AG may be provided. The plurality of pixel regions SP may be separated by the air gaps AG.

The second electrode 143 may be disposed on the light emitting portion 142. Here, the second electrode 143 is formed to follow the morphology of the light emitting portion 142. For example, the second electrode 143 may be formed to have a shape that follows the morphology of the second light-emitting layer 142c including the protrusion PP.

As described above, the first electrode 141, the insulating pattern IP, the light emitting portion 142, and the second electrode 143 overlap to form the light-emitting diode D. The light-emitting diode D may be disposed to correspond to each pixel region SP by the air gap AG.

The encapsulation layer 170, including a first encapsulation layer 171 and a second encapsulation layer 173, may be disposed on the second electrode 143. Here, the first encapsulation layer 171 may be formed to follow the morphology of the second electrode 143. The second encapsulation layer 173 disposed on the first encapsulation layer 171 may have a flat upper surface. The color filter layer 180 may be disposed on the second encapsulation layer 173.

As described above, in the color filter layer 180 of the electroluminescent display device 100 of FIG. 2, a black matrix may be omitted between color filter patterns 181, 183, and 185 so that an emissive area may be increased. As such, paths of rays of light L1 and L2, which are obliquely output from the light-emitting diode D in each pixel region SP, are changed in a vertical direction by the insulating pattern IP which is formed in each pixel region SP and the air gap AG which are formed at the boundary of each pixel region SP and the rays of light L1 and L2 may be output to an upper region corresponding to each pixel region SP. Thus, light extraction efficiency can be improved and at the same time, color mixing can be effectively prevented or reduced.

Further, the carrier generation layer 142b is separately formed in each pixel region SP by the insulating patterns IP, and leakage current can be prevented or reduced from flowing to adjacent pixel regions. Thus, degradation of image quality that is caused due to unintentional driving of the adjacent pixel regions can be prevented or reduced.

FIGS. 4A to 4I are cross-sectional views showing a method of manufacturing the electroluminescent display device according to the example embodiment of the present disclosure shown in FIGS. 2 and 3.

Figure 4A:
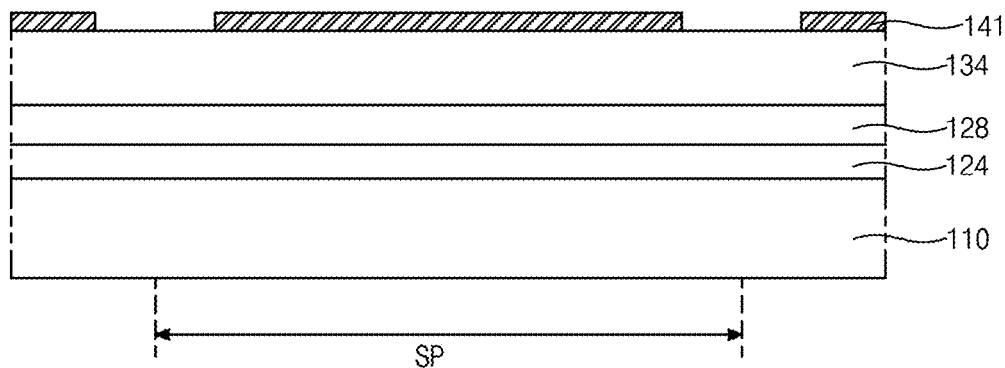
FIGS. 4A to 4I are cross-sectional views showing a method of manufacturing an electroluminescent display device according to the example embodiment of the present disclosure shown in FIGS. 2 and 3.

As shown in FIG. 4A, a substrate 110 including a plurality of pixel regions SP is prepared, a gate insulating layer 124 is formed on the substrate 110, an interlayer insulating layer 128 is formed on the gate insulating layer 124, a passivation layer 134 is formed on the interlayer insulating layer 128, and first electrode 141 is formed on the passivation layer 134 for each pixel region SP. Although not shown, thin film transistor which is electrically connected to the first electrode 141 is disposed in each pixel region SP.

The substrate 110 made of a transparent glass material or an insulating material having relatively high flexibility, such as a transparent plastic or a polymer film, is prepared. An inorganic insulating material is deposited on a substantially entire surface of the substrate 110 by a deposition method such as plasma-enhanced chemical vapor deposition (PECVD) to form the gate insulating layer 124.

The interlayer insulating layer 128 and the passivation layer 134, which are made of an organic or inorganic insulating material, are formed on the gate insulating layer 124 by a method such as PECVD, spin coating, spinless coating, or the like. A TCO material layer such as ITO or IZO or a metal material layer having a relatively high reflectance is formed on a substantially entire surface of the passivation layer 134 and selectively removed by a photolithography process to form the first electrodes 141 separated for each pixel region SP.

Figure 4B:
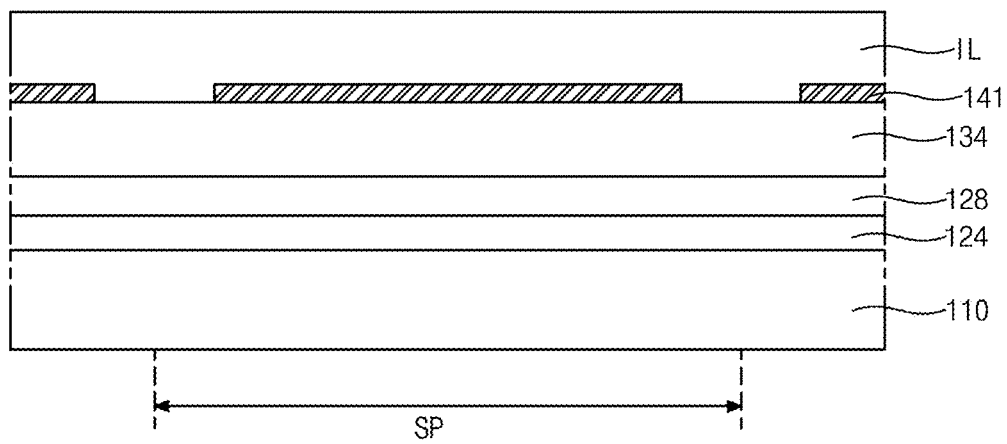

Next, as shown in FIG. 4B, an insulating material layer IL made of a silicon oxide film or the like is deposited on the substantially entire surface of the passivation layer 134 on which the first electrodes 141 are formed. In this case, a refractive index of the insulating material layer IL may be in a range of 1.3 to 1.55.

Figure 4C:
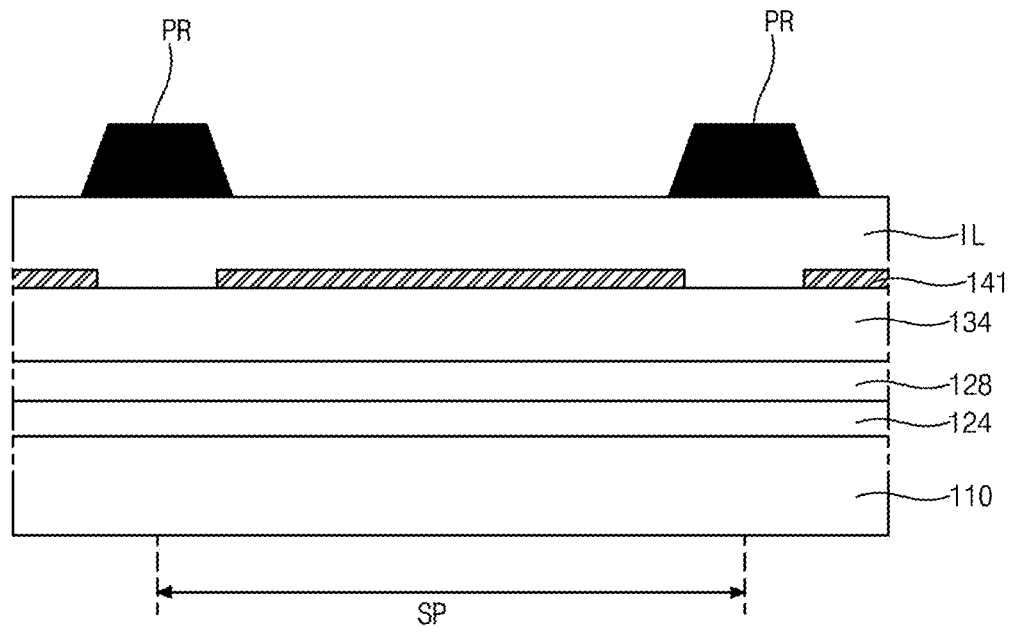

Next, as shown in FIG. 4C, a photoresistor layer may be formed on the insulating material layer IL, and a photoresist pattern PR may be formed on the insulating material layer IL by a photolithography process using a mask pattern. In this case, the photoresist pattern PR is formed to overlap a portion between adjacent first electrodes 141 and ends of the first electrodes 141.

Figure 4D:
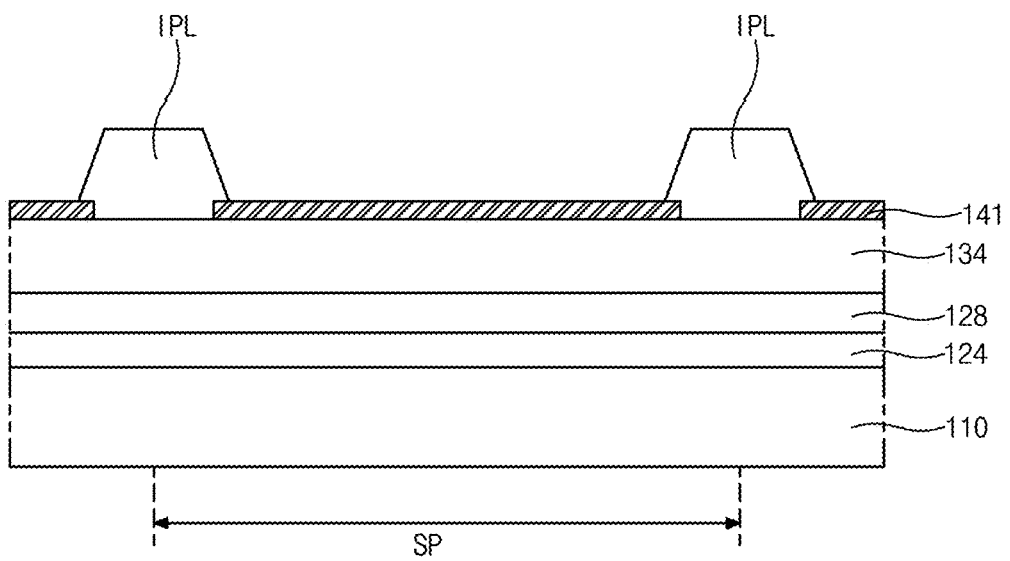

Next, as shown in FIG. 4D, in the insulating material layer IL on which the photoresist pattern PR is formed, a region of the insulating material layer IL on which the photoresist pattern PR is not formed is etched using a radiative ion etching (ME) process, the photoresist pattern PR is removed by a strip process, and the insulating material pattern IPL, which covers a side surface and a portion of an upper surface of the first electrode 141, is formed. In this case, an inner surface of the insulating material pattern IPL may be formed to have a constant tapered shape being inclined with respect to the upper surface of the first electrode 141.

Figure 4E:
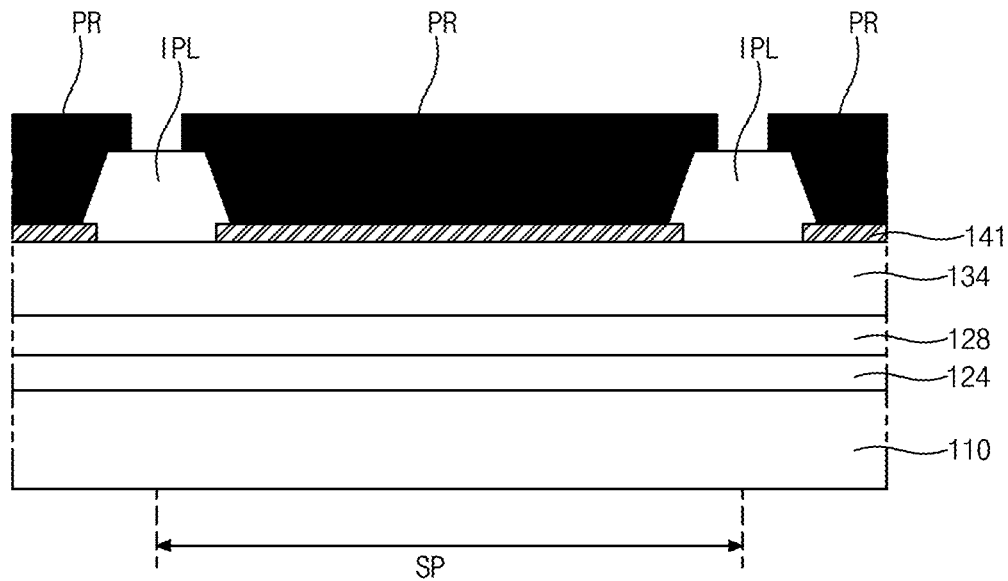

Next, as shown in FIG. 4E, a photoresistor layer may be formed on the first electrode 141 and the insulating material pattern IPL, and a photoresist pattern PR, through which a central region of the insulating material pattern IPL corresponding to a boundary of each pixel region SP is exposed, may be formed by a photolithography process using a mask pattern.

Figure 4F:
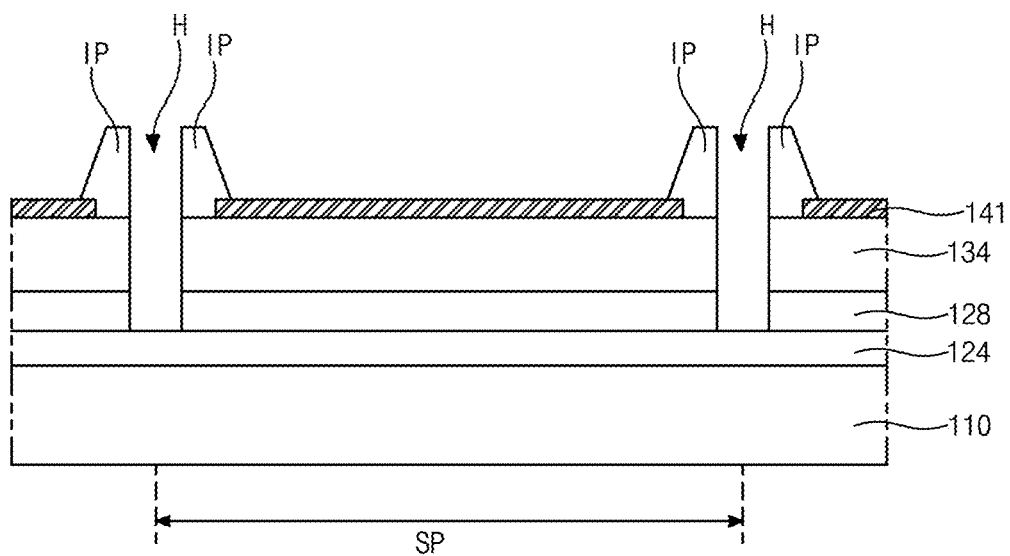

Next, as shown in FIG. 4F, a region of the insulating material layer IPL in which the photoresist pattern PR is not formed is etched, and the interlayer insulating layer 128 and the passivation layer 134 below the region are also etched at the same time. The photoresist pattern PR is removed by a strip process, and a hole H corresponding to each of the boundaries of the plurality of pixel regions SP is formed in the insulating material pattern IPL, and the interlayer insulating layer 128 and the passivation layer 134.

Accordingly, the insulating patterns IP, which are separated for each pixel region SP and cover the side surface and the portion of the upper surface of the first electrode 141, may be formed.

Figure 4G:
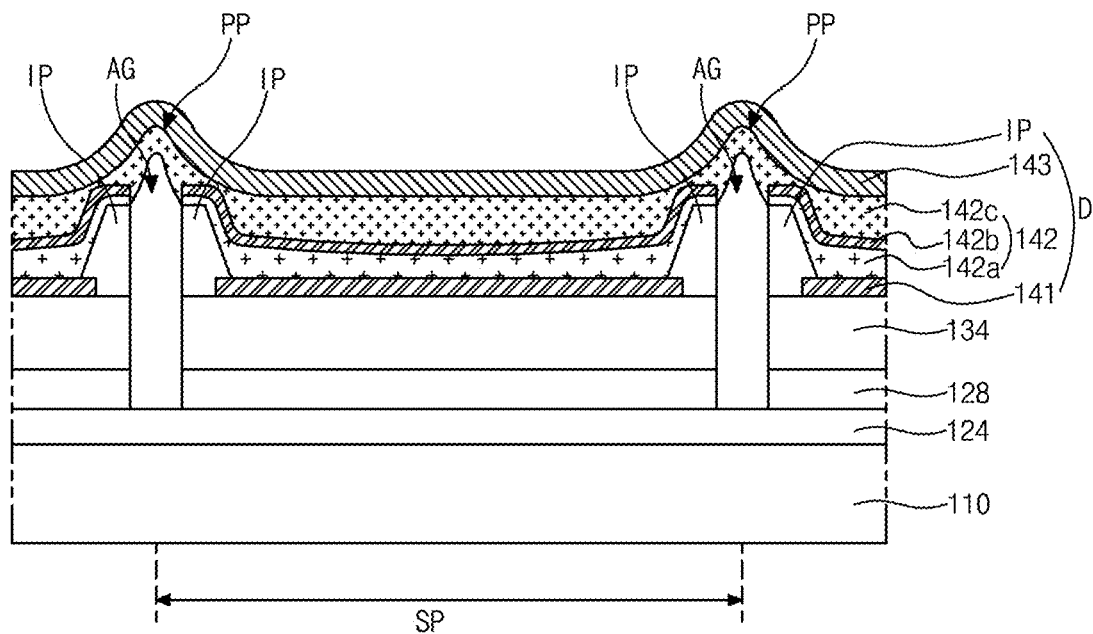

As shown in FIG. 4G, a light emitting portion 142 and a second electrode 143 are formed on the first electrode 141 and the insulating patterns IP. Here, a first light-emitting layer 142a, a carrier generation layer 142b, and a second light-emitting layer 142c are formed to follow morphologies of the first electrode 141 and the insulating pattern IP that are formed on the substrate 110. However, the present disclosure is not limited thereto, and the present disclosure may also be applicable to a three-stack structure or an n-stack structure rather than a two-stack structure.

To this end, although not shown in detail, a first hole injection layer, a first hole transport layer, a blue light light-emitting layer, a first electron transport layer, and a carrier generation layer are sequentially formed on the first electrode 141 surrounded by the insulating patterns IP. In this case, any one of the first hole injection layer and the first hole transport layer may be omitted.

An electron injection layer may be further formed on the first electron transport layer to facilitate injection of electrons. The carrier generation layer 142b may include an N layer for generating electrons and a P layer for generating holes.

Next, a second light-emitting layer 142c including one light-emitting layer or at least two light-emitting layers may be formed on the carrier generation layer 142b to cover the carrier generation layer 142b and the insulating patterns IP. For example, a second hole injection layer, a second hole transport layer, red and green light-emitting layers, a second electron transport layer, and an electron injection layer may be sequentially formed on the carrier generation layer 142b and the insulating patterns IP. In this case, any one of the second hole injection layer and the second hole transport layer may be omitted.

As described above, the present disclosure is not limited to a two-stack structure and the present disclosure may also be applicable to a three-stack structure or an n-stack structure rather than a two-stack structure. For example, the present disclosure may have a three-stack structure in which a second light-emitting layer including yellow and green light-emitting layers are stacked on the above described first light-emitting layer and a third light-emitting layer including a blue light-emitting layer is stacked on the second light-emitting layer. In this case, the carrier generation layer may be disposed not only between the first light-emitting layer and the second light-emitting layer but also between the second light-emitting layer and the third light-emitting layer.

Meanwhile, each of the first light-emitting layer 142a and the carrier generation layer 142b may be deposited separately for each pixel region SP due to a stepped portion between the insulating pattern IP and the first electrode 141. Accordingly, each of the first light-emitting layer 142a and the carrier generation layer 142b may be disconnected from each other for each pixel region SP.

Further, the first light-emitting layer 142a and the carrier generation layer 142b may cover the upper surface of the insulating pattern IP and may be disconnected from each other by the hole H, which is formed in the insulating material pattern IPL and corresponds to the boundary of each of the plurality of pixel regions SP. The second light-emitting layer 142c that is disposed on the carrier generation layer 142b may be deposited in a state of being connected to each other by the deposited thickness. Accordingly, the first light-emitting layer 142a and the carrier generation layer 142b, which are separated in each of the plurality of pixel regions SP, and the second light-emitting layer 142c, which is disposed on entire surfaces of the plurality of pixel regions SP, may be formed.

Due to the shape of the insulating pattern IP, the second light-emitting layer 142c may include protrusions PP corresponding to boundaries of the plurality of pixel regions SP. Accordingly, the second light-emitting layer 142c is formed over the hole H, which is formed in the insulating pattern IP, the passivation layer 134, and the interlayer insulating layer 128, and an air gap AG corresponding to the boundary of each of the plurality of pixel regions SP is formed.

Next, the second electrode 143, which is made of a conductive film formed to follow the morphology of the second light-emitting layer 142c including the protrusion PP, is formed. The conductive film may be formed of a TCO material, such as ITO or IZO, capable of transmitting light, or may be formed of a semi-transmissive conductive material, such as magnesium (Mg), silver (Ag), or an alloy of magnesium (Mg) and silver (Ag). Accordingly, a light-emitting diode D composed of the first electrode 141, the light emitting portion 142, the second electrode 143, and the insulating pattern IP is formed.

Figure 4H:
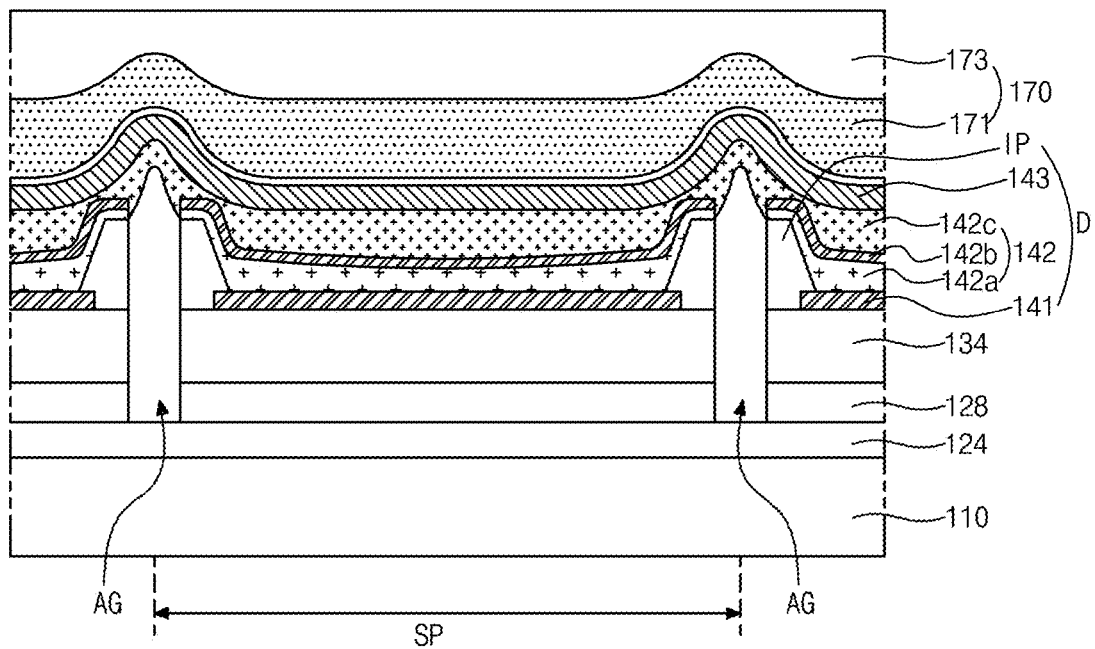

Next, as shown in FIG. 4H, a thin film encapsulation layer 170 having a predetermined thickness is formed on the second electrode 143 to seal the light-emitting diode D. Here, a first encapsulation layer 171, which follows the morphology of the second electrode 143, is formed using chemical vapor deposition (CVD) or atomic layer deposition. In this case, the first encapsulation layer 171 may be made of aluminum oxide ($AlO_x$) or a silicon-based inorganic film and the first encapsulation layer 171 may be a single layer or a multilayer.

A second encapsulation layer 173 having a flat upper surface is formed on the first encapsulation layer 171. In this case, the second encapsulation layer 173 may be formed of an organic film. For example, a polymer material such as an acrylic-based resin, an epoxy-based resin, polyimide, or polyethylene may be used as the second encapsulation layer 173.

Figure 4I:
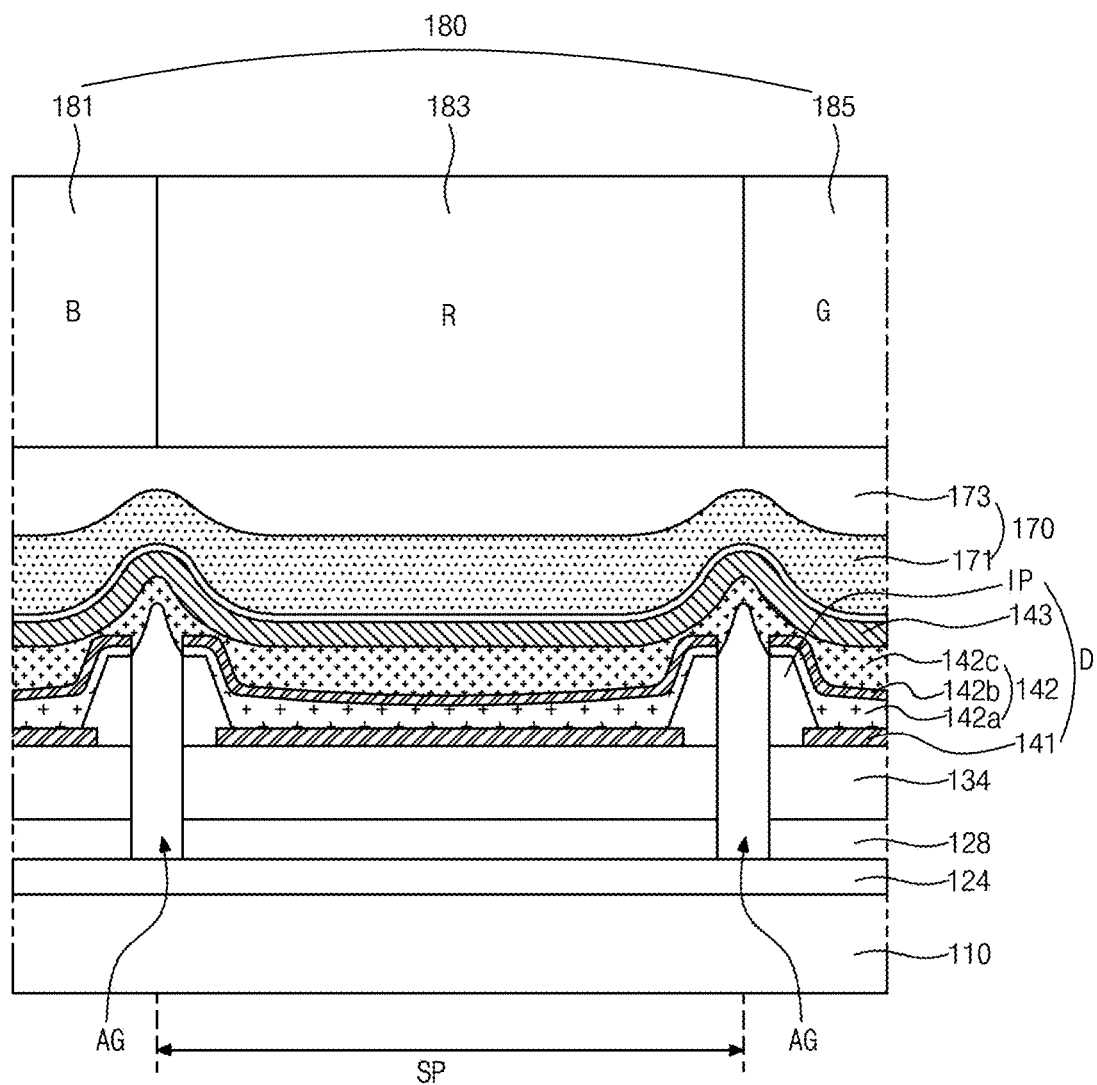

Next, as shown in FIG. 4I, a color filter layer 180 is formed on the second encapsulation layer 173. For example, blue, red, and green color filter patterns 181, 183, and 185 may be formed in regions corresponding to the respective pixel regions SP on the second encapsulation layer 173.

As described above, in the color filter layer 180 of the electroluminescent display device 100 of FIG. 2, a black matrix may be omitted between the color filter patterns 181, 183, and 185 so that a light emitting area may be increased.

Further, paths of rays of light L1 and L2 of FIG. 3, which are obliquely output from the light-emitting diode D in each pixel region SP, are changed in a vertical direction by the insulating pattern IP which is formed in each pixel region SP and the air gaps AG which are formed at the boundary of each pixel region SP and the rays of light L1 and L2 may be output to an upper region corresponding to each pixel region SP. Thus, light extraction efficiency can be improved and at the same time, color mixing can be effectively prevented or reduced.

Further, because the carrier generation layer 142b is separately formed in each pixel region SP by the insulating pattern IP, leakage current can be prevented or reduced from flowing to adjacent pixel regions. Thus, degradation of image quality caused by unintentional driving of the adjacent pixel regions can be prevented or reduced.

In embodiments of the present disclosure, air gaps are formed at boundaries of pixel regions, an insulating pattern is formed to cover an edge of a first electrode and a portion of a side surface of a light emitting portion. A carrier generation layer is separately formed in each of the plurality of pixel regions.

As described above, in the present disclosure, the carrier generation layer is cut by the air gap to improve light extraction efficiency and prevent current leakage and color mixing. However, the present disclosure is not limited thereto. The gist of the present disclosure is an air gap formed over the substrate, which may separate the plurality of pixel regions. In an electroluminescent display device, the driving of one pixel region may affect adjacent pixel region.

Thus, to separate the plurality of pixel regions may bring better display effect. In some embodiments, at least one portion of the light emitting portion in a direction perpendicular to the substrate are disposed separately in each of the plurality of pixel regions due to the air gap. For example, the light emitting portion may include one or more functional layers. If necessary, one functional layer, more functional layers, or even all of the functional layers of the light emitting portion may be cut by the air gap, or a portion of one layer may be cut by the air gap. In addition, in some embodiments, an insulating pattern may be configured to surround the at least one portion of the light emitting portion which is disposed separately without covering an edge of the first electrode. Though the protrusion is described above, in some embodiments, the second light-emitting layer includes a recess above the air gap rather than the protrusion, and the second electrode and the first encapsulation layer follow a morphology of the second light-emitting layer including the recess.

It will be apparent to those skilled in the art that various modifications and variations can be made in the electroluminescent display device of the present disclosure without departing from the technical idea or scope of the disclosure. Thus, it is intended that the present disclosure cover the modifications and variations of this disclosure provided they come within the scope of the appended claims and their equivalents.

What is claimed is:

1. An electroluminescent display device, comprising:
   a substrate;
   a plurality of pixel regions on the substrate;
   an air gap over the substrate and configured to separate the plurality of pixel regions;
   a first electrode in each of the plurality of pixel regions;
   a light emitting portion in each of the plurality of pixel regions and on the first electrode; and
   a second electrode on the light emitting portion,
   wherein the light emitting portion includes a first light-emitting layer, a carrier generation layer, and a second light-emitting layer which are sequentially stacked, and
   wherein the carrier generation layer of each of the plurality of pixel regions is separated by the air gap.

2. The electroluminescent display device of claim 1, wherein the first light-emitting layer and the carrier generation layer of each of the plurality of pixel regions are completely separated by the air gap.

3. The electroluminescent display device of claim 1, wherein:
   the first electrode, the first light-emitting layer, and the carrier generation layer of each of the plurality of pixel regions are separated; and
   the second light-emitting layer and the second electrode of each of the plurality of pixel regions are connected.

4. The electroluminescent display device of claim 1, wherein at least one portion of the light emitting portion in a direction perpendicular to the substrate is disposed separately due to the air gap.

5. The electroluminescent display device of claim 1, wherein the carrier generation layer is disposed separately in each of the plurality of pixel regions spaced apart by the air gap.

6. The electroluminescent display device of claim 1, further comprising:
   an insulating pattern covering an edge of the first electrode,
   wherein the light emitting portion is further disposed on the first electrode and the insulating pattern.

7. The electroluminescent display device of claim 6, wherein the light emitting portion is formed on a surface of the insulating pattern facing each other at one air gap.

8. The electroluminescent display device of claim 6, wherein the insulating pattern is disposed separately in each of the plurality of pixel regions spaced apart by the air gap.

9. The electroluminescent display device of claim 7, wherein:
   the air gap includes a first portion contacting the insulating pattern and a second portion contacting the second light-emitting layer; and
   a width of the second portion is decreased toward an upper portion of the second portion.

10. The electroluminescent display device of claim 9, wherein a width of the first portion of the air gap is constant.

11. The electroluminescent display device of claim 9, wherein:
    the second light-emitting layer includes a protrusion; and
    the protrusion covers an upper portion of the air gap, is formed on entire surfaces of the plurality of pixel regions, and is formed to correspond to each of boundaries of the plurality of pixel regions.

12. The electroluminescent display device of claim 11, further comprising a first encapsulation layer on the second electrode.

13. The electroluminescent display device of claim 12, wherein the second electrode and the first encapsulation layer follow a morphology of the second light-emitting layer including the protrusion.

14. The electroluminescent display device of claim 13, further comprising:
    a second encapsulation layer having a flat upper surface and on the first encapsulation layer; and
    a color filter layer on the second encapsulation layer.

15. The electroluminescent display device of claim 1, further comprising:
    a passivation layer between the substrate and the first electrode; and
    an interlayer insulating layer between the substrate and the passivation layer,
    wherein each of the passivation layer and the interlayer insulating layer is disposed separately in each of the plurality of pixel regions spaced apart by the air gap.

16. The electroluminescent display device of claim 1, wherein the first light-emitting layer has a concave shape.

17. The electroluminescent display device of claim 1, wherein the second light-emitting layer has a concave shape.

18. The electroluminescent display device of claim 1, wherein the second electrode has a concave shape.

19. The electroluminescent display device of claim 14, wherein:
    the color filter layer includes color filter patterns corresponding to each of the plurality of pixel regions; and
    there is no black matrix between the color filter patterns.

20. The electroluminescent display device of claim 6, wherein a path of light, which is obliquely output from the light-emitting portion of each of the plurality of pixel regions, is changed in a direction perpendicular to the substrate by the insulating pattern and the air gap.

* * * * *